(12) United States Patent
Debenham et al.

(10) Patent No.: US 6,194,738 B1
(45) Date of Patent: Feb. 27, 2001

(54) METHOD AND APPARATUS FOR STORAGE OF TEST RESULTS WITHIN AN INTEGRATED CIRCUIT

(75) Inventors: Brett Debenham; Kim Pierce, both of Meridian, ID (US); Douglas J. Cutter, Fort Collins, CO (US); Kurt Beigel, Boise, ID (US); Fan Ho, Sunnyvale, CA (US); Patrick J. Mullarkey, Meridian; Dien Luong, Boise, both of ID (US); Hua Zheng, Fremont, CA (US); Michael Shore; Jeffrey P. Wright, both of Boise, ID (US); Adrian E. Ong, Pleasanton, CA (US); Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/032,417

(22) Filed: Feb. 27, 1998

Related U.S. Application Data

(63) Continuation-in-part of application No. 08/591,238, filed on Jul. 25, 1996, now abandoned, and a continuation-in-part of application No. 08/664,109, filed on Jun. 13, 1996, now Pat. No. 5,005,962.

(51) Int. Cl.$^7$ .................................................. H01L 23/58
(52) U.S. Cl. .............................. 257/48; 257/529; 365/96; 365/225.7; 438/14; 438/131
(58) Field of Search .............................. 365/94, 96, 200, 365/201, 225.7, 48; 257/529, 530; 438/12, 14, 17, 18, 131, 132

(56) References Cited

U.S. PATENT DOCUMENTS

| | | | |
|---|---|---|---|
| 5,110,754 | 5/1992 | Lowrey et al. | 437/52 |
| 5,235,550 | 8/1993 | Zagar | 365/226 |
| 5,301,143 | 4/1994 | Ohri et al. | 365/96 |
| 5,345,110 | 9/1994 | Renfro et al. | 307/272.3 |
| 5,352,945 | 10/1994 | Casper et al. | 307/603 |
| 5,424,652 | 6/1995 | Hembree et al. | 324/765 |
| 5,428,311 | 6/1995 | McClure | 327/276 |
| 5,440,240 | 8/1995 | Wood et al. | 324/765 |
| 5,563,832 | 10/1996 | Kagami | 365/200 |
| 5,590,069 | * 12/1996 | Levin | 365/96 |
| 5,617,366 | 4/1997 | Yoo | 365/201 |
| 5,619,469 | 4/1997 | Joo | 365/225.7 |

OTHER PUBLICATIONS

Micron Technology, Inc., *Quality Reliability Handbook*, 1995, entire book.

* cited by examiner

Primary Examiner—Kevin M. Picardat
(74) Attorney, Agent, or Firm—Dorsey & Whitney LLP

(57) ABSTRACT

An integrated circuit memory device has a plurality of nonvolatile programmable elements which are used to store a pass/fail status bit at selected milestones in a test sequence. At selected points in the test process an element may be programmed to indicate that the device has passed the tests associated with the selected point in the process. Prior to performing further tests on the device, the element is read to verify that it passed previous tests in the test process. If the appropriate elements are not programmed, the device is rejected. A rejected device may be retested according to the previous test steps. Laser fuses, electrically programmable fuses or antifuses are used to store test results. The use of electrically writeable nonvolatile memory elements allows for programming of the elements after the device has been packaged.

51 Claims, 11 Drawing Sheets

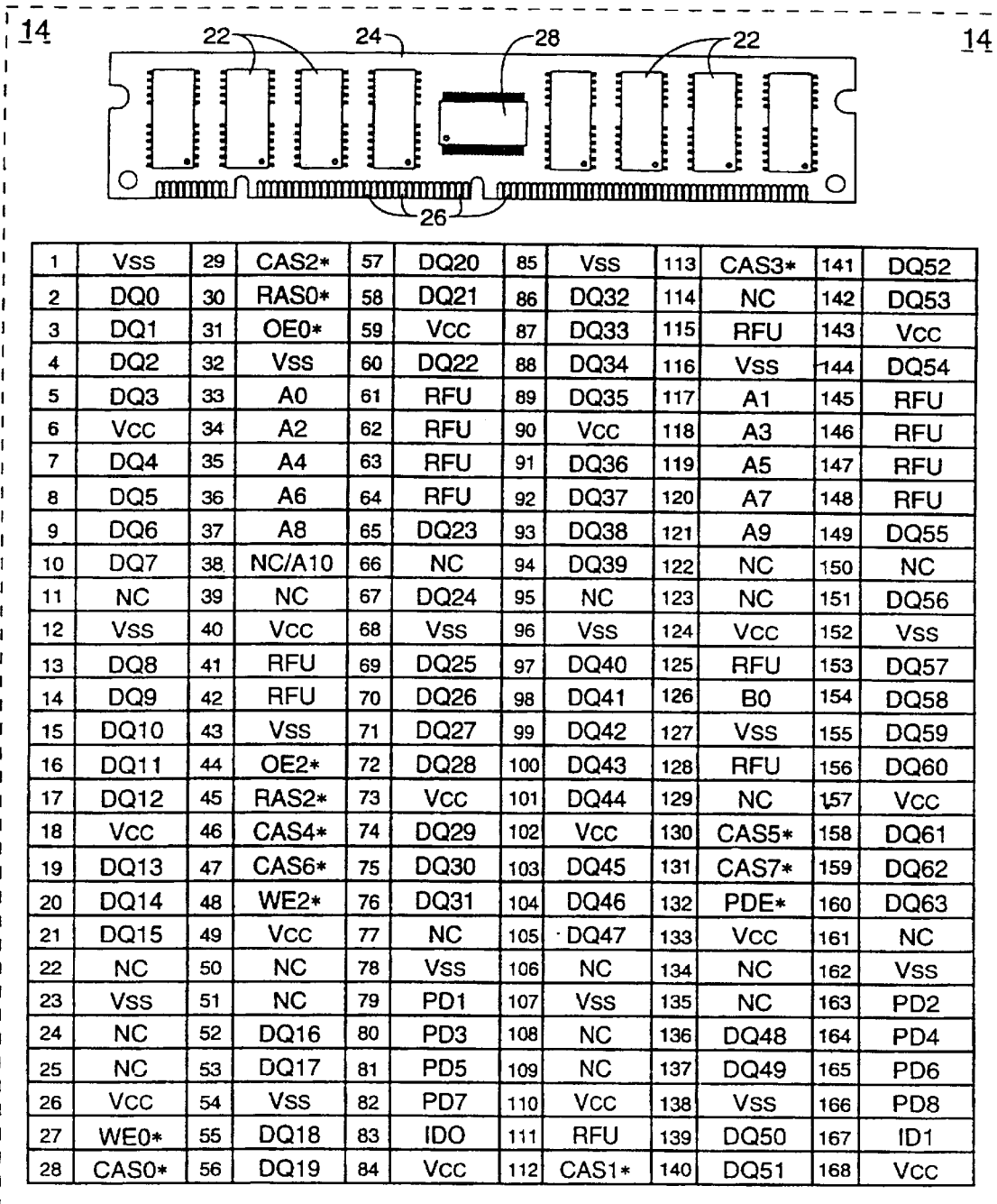

| 1 | Vss | 29 | CAS2* | 57 | DQ20 | 85 | Vss | 113 | CAS3* | 141 | DQ52 |
| --- | --- | --- | --- | --- | --- | --- | --- | --- | --- | --- | --- |
| 2 | DQ0 | 30 | RAS0* | 58 | DQ21 | 86 | DQ32 | 114 | NC | 142 | DQ53 |
| 3 | DQ1 | 31 | OE0* | 59 | Vcc | 87 | DQ33 | 115 | RFU | 143 | Vcc |
| 4 | DQ2 | 32 | Vss | 60 | DQ22 | 88 | DQ34 | 116 | Vss | 144 | DQ54 |
| 5 | DQ3 | 33 | A0 | 61 | RFU | 89 | DQ35 | 117 | A1 | 145 | RFU |
| 6 | Vcc | 34 | A2 | 62 | RFU | 90 | Vcc | 118 | A3 | 146 | RFU |
| 7 | DQ4 | 35 | A4 | 63 | RFU | 91 | DQ36 | 119 | A5 | 147 | RFU |
| 8 | DQ5 | 36 | A6 | 64 | RFU | 92 | DQ37 | 120 | A7 | 148 | RFU |
| 9 | DQ6 | 37 | A8 | 65 | DQ23 | 93 | DQ38 | 121 | A9 | 149 | DQ55 |
| 10 | DQ7 | 38 | NC/A10 | 66 | NC | 94 | DQ39 | 122 | NC | 150 | NC |
| 11 | NC | 39 | NC | 67 | DQ24 | 95 | NC | 123 | NC | 151 | DQ56 |
| 12 | Vss | 40 | Vcc | 68 | Vss | 96 | Vss | 124 | Vcc | 152 | Vss |
| 13 | DQ8 | 41 | RFU | 69 | DQ25 | 97 | DQ40 | 125 | RFU | 153 | DQ57 |
| 14 | DQ9 | 42 | RFU | 70 | DQ26 | 98 | DQ41 | 126 | B0 | 154 | DQ58 |
| 15 | DQ10 | 43 | Vss | 71 | DQ27 | 99 | DQ42 | 127 | Vss | 155 | DQ59 |
| 16 | DQ11 | 44 | OE2* | 72 | DQ28 | 100 | DQ43 | 128 | RFU | 156 | DQ60 |
| 17 | DQ12 | 45 | RAS2* | 73 | Vcc | 101 | DQ44 | 129 | NC | 157 | Vcc |
| 18 | Vcc | 46 | CAS4* | 74 | DQ29 | 102 | Vcc | 130 | CAS5* | 158 | DQ61 |
| 19 | DQ13 | 47 | CAS6* | 75 | DQ30 | 103 | DQ45 | 131 | CAS7* | 159 | DQ62 |
| 20 | DQ14 | 48 | WE2* | 76 | DQ31 | 104 | DQ46 | 132 | PDE* | 160 | DQ63 |
| 21 | DQ15 | 49 | Vcc | 77 | NC | 105 | DQ47 | 133 | Vcc | 161 | NC |
| 22 | NC | 50 | NC | 78 | Vss | 106 | NC | 134 | NC | 162 | Vss |
| 23 | Vss | 51 | NC | 79 | PD1 | 107 | Vss | 135 | NC | 163 | PD2 |
| 24 | NC | 52 | DQ16 | 80 | PD3 | 108 | NC | 136 | DQ48 | 164 | PD4 |
| 25 | NC | 53 | DQ17 | 81 | PD5 | 109 | NC | 137 | DQ49 | 165 | PD6 |
| 26 | Vcc | 54 | Vss | 82 | PD7 | 110 | Vcc | 138 | Vss | 166 | PD8 |
| 27 | WE0* | 55 | DQ18 | 83 | ID0 | 111 | RFU | 139 | DQ50 | 167 | ID1 |
| 28 | CAS0* | 56 | DQ19 | 84 | Vcc | 112 | CAS1* | 140 | DQ51 | 168 | Vcc |

Fig. 2

METHOD AND APPARATUS FOR STORAGE OF TEST RESULTS WITHIN AN INTEGRATED CIRCUIT

CROSS-REFERENCES TO RELATED APPLICATIONS

This application is a continuation-in-part of U.S. patent application Ser. Nos. 08/591,238, filed Jan. 17, 1996, now abandoned, and 08/664,109, filed Jun. 13, 1996, now U.S. Pat. No. 5,895,962.

FIELD OF THE INVENTION

This invention relates to integrated circuit test circuits and methods. The invention is particularly related to semiconductor memory devices having internal test circuits, and methods of testing semiconductor memory devices.

BACKGROUND OF THE INVENTION

Semiconductor integrated circuit devices are manufactured on a thin wafer of semiconductor material. Generally many devices are manufactured on a single wafer. These devices may be tested with electrical probes to verify functionality of the devices prior to singulation and/or packaging of individual devices. After a device is packaged, further tests are performed. Devices which do not receive a conventional device package may be tested in a temporary package or die holder, and later shipped in die form. Devices which are shipped in die form after passing a complete test flow may be termed Known Good Die (KGD). Some electrical tests may be performed in a Burn-In oven to weed out parts that would likely fail within a short period of time after being sold if the Burn-In step was not performed. In addition to Probe and Burn-In, parts may be tested both hot and cold to verify functionality over specified environmental conditions.

A complete test flow will often require that parts move from one piece of test equipment to another. A first piece of test equipment and test fixtures may be utilized for Probe, another for Burn-In, and yet another for packaged part testing after Burn-In. After being tested on a particular piece of test equipment, the parts may be sorted into bins according to the test results. Occasionally a part may be misbinned i.e., placed in an incorrect bin. This may occur as a result of machine malfunction, or human error. A failed part that is incorrectly placed in a passing bin has the potential of completing the test flow without further failures and may then be sold as a fully functional part.

SUMMARY OF THE INVENTION

An integrated circuit device has nonvolatile memory elements which are programmed to reflect successful completion of a test or series of tests, or completion of a formation step or a series of formation steps of a semiconductor process. Prior to peforming additional tests, the nonvolatile memory element corresponding to successful completion of a previous test is read to verify that the part has indeed successfully completed the previous test. The nonvolatile memory elements may also be read prior to performing other production related activities such as packaging the device, and performing quality assurance checks. The nonvolatile memory elements may also be read prior to sale of the devices, and in the event that a device is returned from a customer. The integrated circuit may be a memory device such as a Dynamic Random Access Memory (DRAM), Static Random Access Memory (SRAM), Video Random Access Memory (VRAM), etc. The invention is also applicable to other types of integrated circuit devices such as microprocessors, microcontrollers, memory controllers, Application Specific Integrated Circuits (ASICs), etc. Generally, any integrated circuit which requires multiple test steps and in which a nonvolatile memory element can be incorporated without prohibitively increasing the device manufacturing cost is a candidate for incorporation of the invention.

Large volumes of data may be recorded in the process of testing a single integrated circuit device. It is not feasible to store all of this information on the device itself. In accordance with the present invention, an antifuses is blown at predetermined test milestones to record a successful completion of tests associated with the milestone. Devices which do not successfully pass the tests do not have the fuse blown. Subsequent testing of each memory chip proceeds after verification of the blown fuse indicating that the device has passed previous test procedures. Memory devices which do not pass the tests or which do not have the fuse blown are removed from the test flow.

In an alternate embodiment of the present invention, multiple fuses are used to store information concerning the results of a test process. For example, three nonvolatile memory elements may be used to store one of eight bin numbers each of which represent a part classification based on the test results.

Nonvolatile memory elements associated with test results may be used by customers as part of their incoming inspection process. The data stored in these elements may represent standard test results, or results of tests that are specific to the customer.

After initial testing, devices which pass the tests are sent to a memory device assembly area to be packaged. Some devices may not require packaging as they may be destined to be shipped in die form as Known Good Die (KGD) devices.

Prior to encapsulation, nonvolatile memory elements may be read to verify that previous test sequences have been successfully completed. After packaging, the memory devices are tested further. Device Burn-in and other test procedures are performed to verify functionality of the devices after packaging and in adverse environmental conditions. These tests are also useful in detecting devices which are subject to infant mortality. In a preferred embodiment of the invention, devices which pass some or all of these remaining tests have antifuses which are associated with post packaging test milestones. These antifuses are programmed by application of electrical signals to device inputs and/or outputs. As a final inspection prior to shipping the devices, all appropriate fuses may be read to verify successful completion of all test procedures. While certain test procedures are described such as probe testing, Burn-In, etc., it should be noted that the invention is not limited to test flows which utilize these procedures. Alternate test flows in which some or all of these tests are not performed, in which additional tests are performed, or in which multiple tests are combined into a single test are equally valid. Furthermore, nonvolatile memory elements other than antifuses may be used to store the test or formation data.

BRIEF DESCRIPTION OF THE DRAWINGS

The features of the invention as well as objects and advantages will be best understood by reference to the appended claims, detailed description of particular embodiments and the accompanying drawings where:

FIG. 2 is a front view and pin assignment of a memory module.

DESCRIPTION OF THE INVENTION

Figure 1:
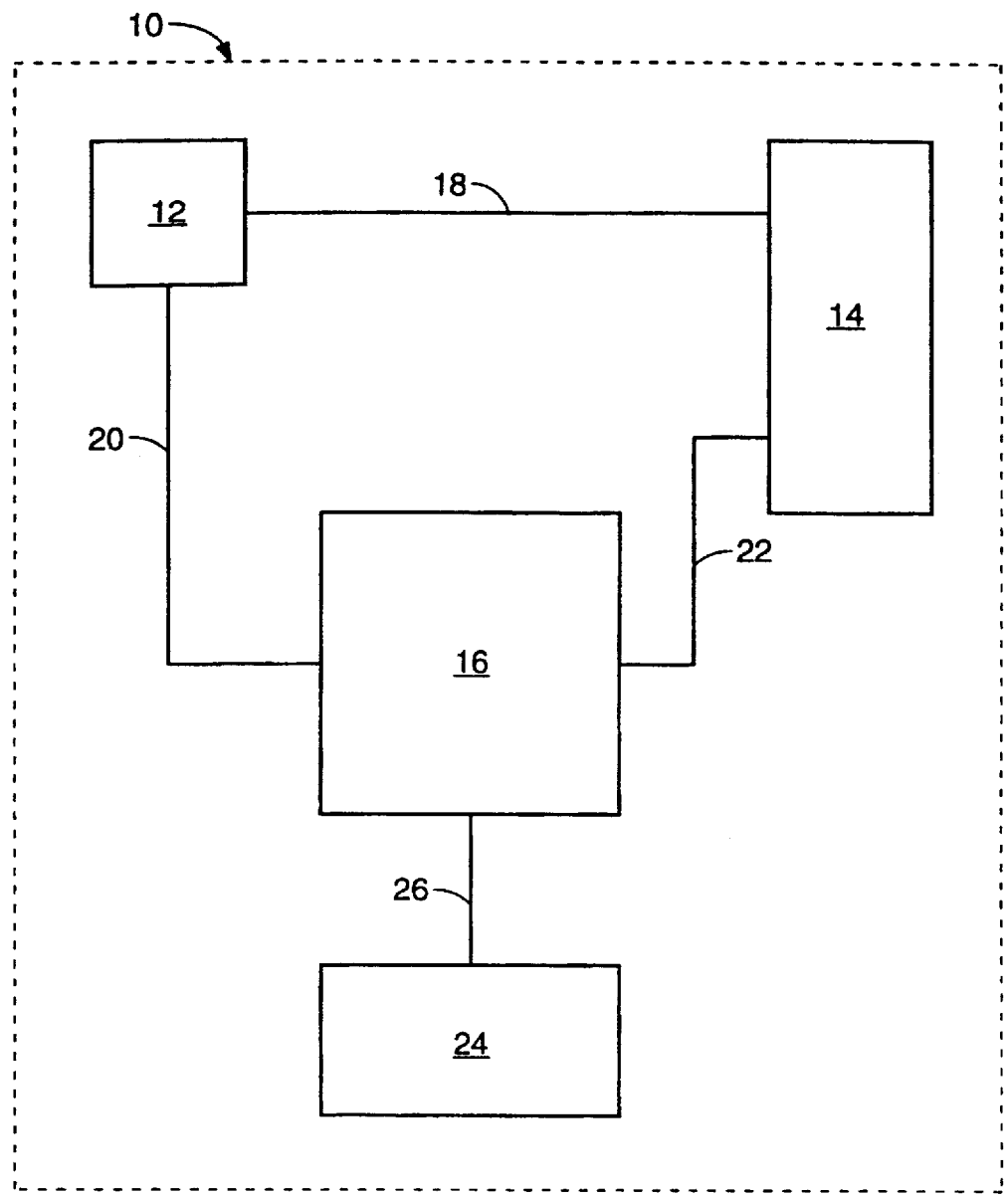
FIG. 1 is a block schematic diagram of a computer system.

A computer system 10 as shown in FIG. 1 has a microprocessor 12 which is coupled to a memory module 14 by control circuit 16 and a data bus 18. Memory module 14 may be, but is not limited to, being a removable module such as a Dual In-Line Memory Module (DIMM), a Single In-Line Memory Module (SIMM), or Multi-Chip Module (MCM). Alternatively, the memory module 14 may be a memory circuit which is directly coupled to the system such as a fast SRAM cache. Control circuit 16 receives microprocessor address and control signals 20 from the microprocessor 12 and sends memory module address and control signals 22 to memory module 14. Video information may be sent to display 24 via signals 26 from control circuit 16.

FIG. 2 is a front view and pin assignment of a DIMM which may be representative of the memory module 14 of FIG. 1. The DIMM module 14 of FIG. 2 is made up of a plurality of memory devices 22 which are mounted on a printed circuit board 24. Data stored in the DIMM is accessible to the microprocessor 12 of FIG. 1 through connector 26. Address and control signals may be buffered through buffer 28 to reduce loading on these signals. Additional information concerning DIMM 14 as well as alternate memory modules may be found in the MICRON TECHNOLOGY INC. 1995 DRAM DATA BOOK, herein incorporated by reference.

Figure 3:
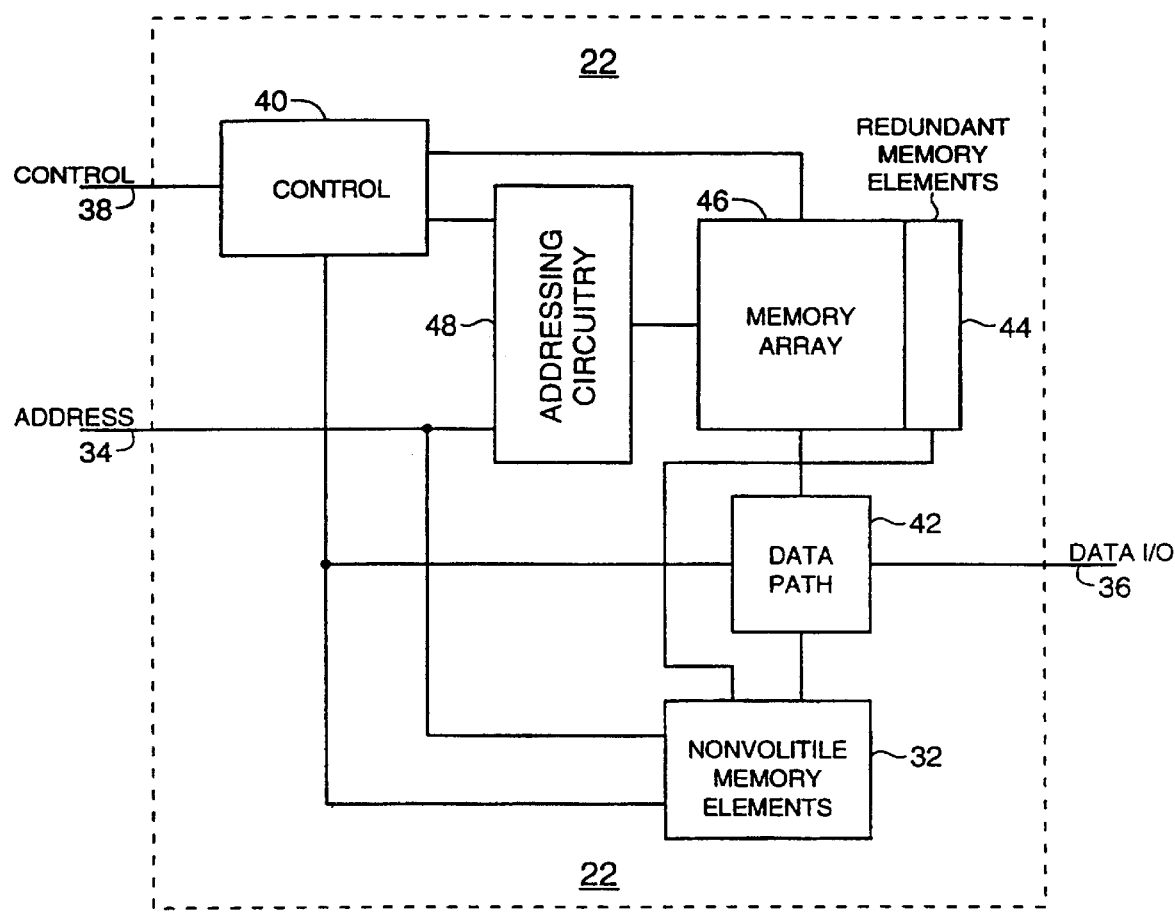
FIG. 3 is a schematic diagram of a memory device.

FIG. 3 is a block schematic diagram of a DRAM which may be representative of one of the memory devices 22 of FIG. 2. The DRAM of FIG. 2 may be any one of a wide variety which are currently available, and others which will become available as new memory devices are developed and manufactured. Within memory device 22, are a plurality of nonvolatile memory elements 32. The nonvolatile memory elements may be laser fuses, electrical fuses, antifuses, or a combination thereof. Alternatively, the nonvolatile memory elements may be FLASH memory cells, FERAM memory cells, or any other nonvolatile type of memory cell. The preferred type of nonvolatile memory cell will depend largely on the integrated circuit device type and the process used to fabricate the integrated circuit. In a preferred embodiment of the present invention, the memory device is a DRAM, and the nonvolatile memory elements are electrically programmable antifuses. The use of nonvolatile memory elements within DRAMs is well known in the industry. Laser fuses for example, have been widely used for enabling redundant memory elements to replace nonfunctional elements within DRAM devices.

Nonvolatile memory elements 32 receive address 34, data 36 and control 38 inputs either directly or through control circuitry such as DRAM control circuit 40 and data path control circuit 42. These inputs may be used to program and/or read the nonvolatile memory elements. Outputs of the nonvolatile memory elements are used to enable redundant memory elements 44 and may also be read out of the device over data input/output lines 36. Memory device 22 is primarily used for data storage in memory array 46 in which individual elements or groups of elements are addressed by address 34 through addressing circuitry 48.

Figure 4:
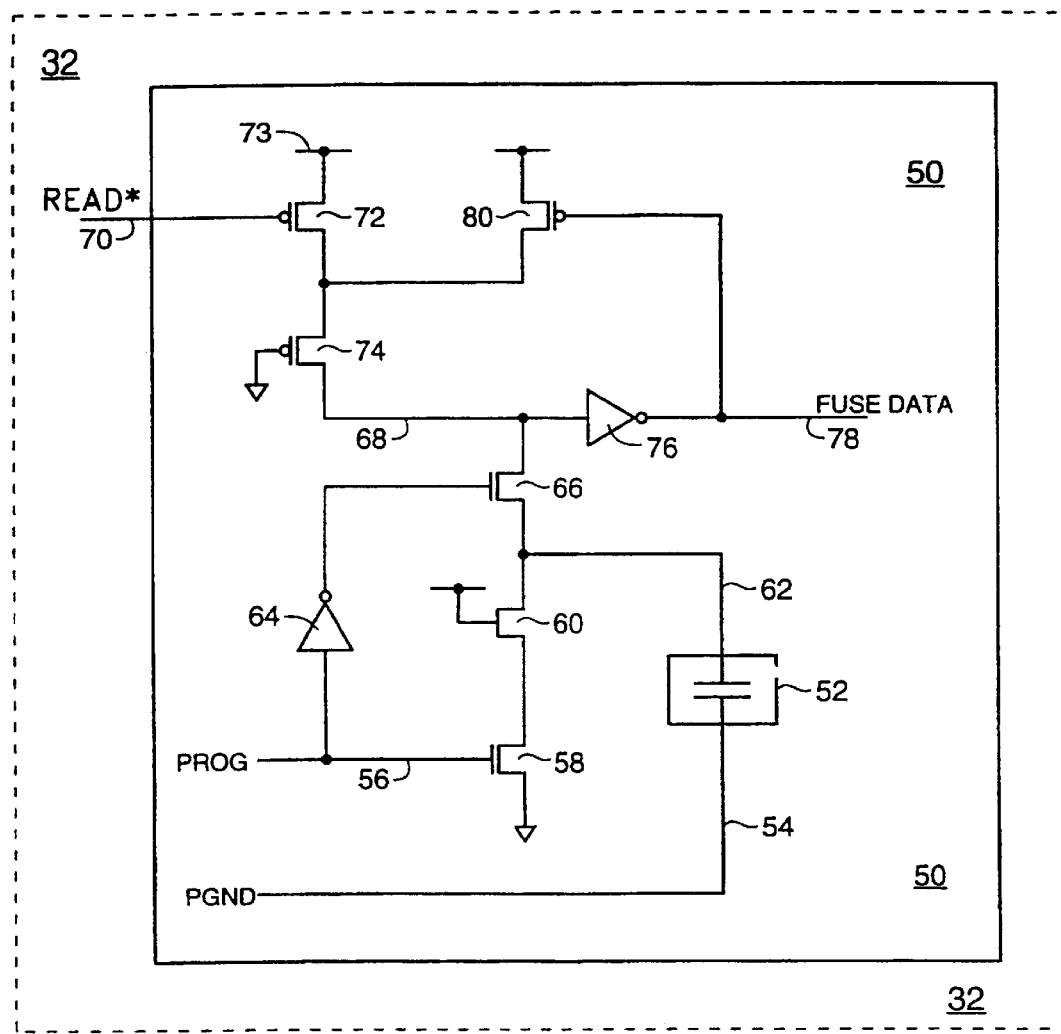
FIG. 4 is a schematic diagram of an antifuse circuit.

FIG. 4 is a schematic diagram of an antifuse circuit 50 which may be used as a single nonvolatile memory element which may be utilized to store test result information in an integrated circuit such as the memory device 22 of FIG. 2. In one embodiment of the present invention, a plurality of antifuse nonvolatile memory elements 50 along with control circuitry, not shown, will make up the nonvolatile memory element circuit 32 of FIG. 3.

Antifuse element 52 is manufactured in a manner which is similar to the manufacture of a capacitor. An unblown antifuse has two electrodes separated by a dielectric. If the antifuse element remains unprogrammed, there is no current path through the element. To program the antifuse, input PGND on signal node 54 is elevated to a programming potential, and signal PROG 56 is taken to a logic high potential. While signal 56 is high, device 58 will provide a path to ground through device 60 to node 62. The potential difference between the programming potential and ground is sufficient to cause the dielectric of the antifuse structure to break down and the two nodes 54 and 62 become shorted together. Thus, when programmed, a current path does exist between nodes 54 and 62. The antifuse is a binary signal storage device since a binary logic level can be associated with the blown and unblown states of the anti fuse through the presence or absence of a current path through the device. After programming selected devices, the PGND signal 54 and the PROG signal 56 are both coupled to logic low potentials. While PROG is at a logic low potential, inverter 64 activates device 66 which provides a path for a logic low level at node 62 to be coupled to node 68 if antifuse 52 is conductive. To read the antifuse, signal READ* 70 is coupled to a logic low potential which turns on device 72. Device 72 couples a high potential from Vcc node 73 through a resistive device 74 to node 68. If the antifuse is conductive, node 68 will remain low since device 74 is designed to be more resistive than the programmed antifuse. If the antifuse is not blown (nonconductive), node 68 will go high. Output node 78 will be driven to the opposite state of node 68 by inverter 76. If antifuse 52 is blown, a low potential will remain at node 68, and node 78 will remain high. If the antifuse is unblown, node 68 will go high when the antifuse is read, node 78 will go low and device 80 will be turned on to provide a path from Vcc to node 68 through resistive device 74. Device 80 is used to latch the high level logic state at node 68 after the READ* signal is brought back high after a read function. If the READ* is not brought back high after the read function, a DC current path from Vcc to ground may exist through a blown antifuse.

Programming signals READ* 70, PROG and PGND may be logically derived through the use of a test sequence of control signals such as a Write-CAS-Before-RAS (WCBR) programming cycle in a DRAM, the use of a super voltage signal, or other methods of performing test functions within an integrated circuit. The programming potential may be applied to a device input, or may be internally generated through the use of a charge pump circuit.

Laser fuses may be programmed through the use of a laser. In nonvolatile memory devices such as FLASH memory devices, a number of memory elements of the array of memory elements may be utilized to store the test information. For example, a piece of test equipment may read a set of bits representing test results from a predetermined memory location, perform a test of the memory device and then rewrite the test results back into a predetermined location. The test results that are written back into the device may be updated to reflect the results of the most current test. Since this data would be lost when the device is erased, it is not as desirable as adding a number of dedicated nonvolatile memory elements which may be maintained throughout the life of the part. Similarly, test status bits could be maintained in a DRAM cell as long as power is applied to the DRAM, but would also be lost once power is removed. Reading the nonvolatile memory elements may be by optical means, normal device read cycles, or special test mode cycles such as super voltage or WCBR cycles. Other methods of programming and reading nonvolatile storage elements within an integrated circuit may be appropriate depending on the particular characteristics of the integrated circuit.

While the antifuse circuit of FIG. 4 is drawn towards a DRAM, it should be understood that the invention is not limited to DRAM applications. The microprocessor of FIG. 1 for example, may have a nonvolatile memory storage area in which test results are stored at various milestones within the test process. Other device types may also take advantage of this invention to store test results within a tested device.

Figure 5:
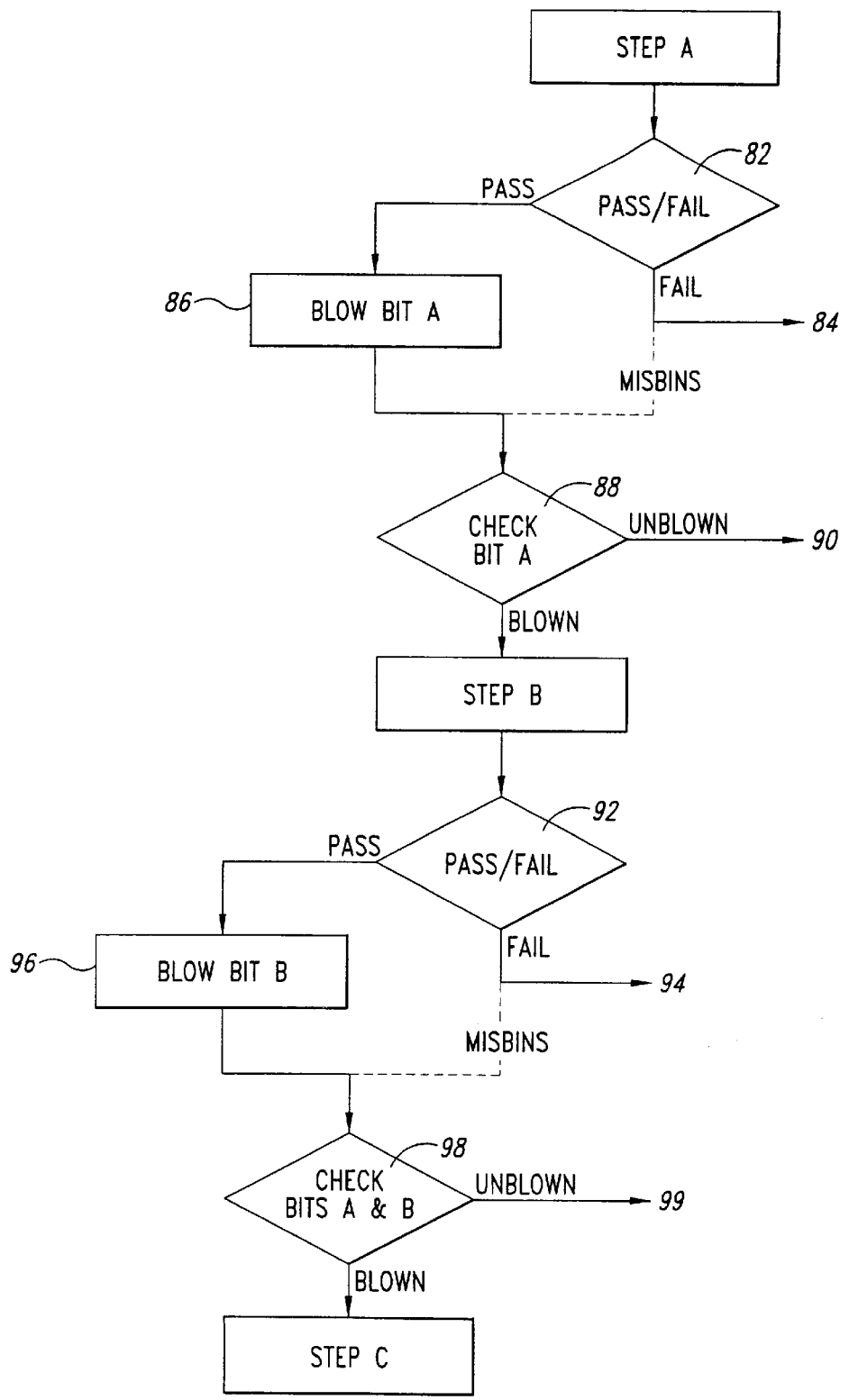
FIG. 5 is a flow chart of a test process.

Referring to FIG. 5, nonvolatile memory elements, such as those discussed below in conjunction with FIGS. 7–11, can be used to store data during the manufacture of the circuit or device that contains them, such as the memory device 10 of FIG. 1. The stored data may include information regarding the device's formation, such as the identity of a particular process step or sequence of process steps used to form a portion or portions of the integrated device, or may include the identity or result of a test performed on the integrated device during its manufacture. This information may be used after the manufacture of the device for troubleshooting and other purposes. Alternatively, this type of data or other characteristics of the integrated device may be stored in nonvolatile memory elements during the manufacture of the integrated device, and may be read at a subsequent time during the manufacture to control the manufacturing flow. For example, based on the stored data value, a particular process step or sequence may be chosen or omitted, or a particular test may be performed or omitted. This allows electronic checking of the integrated-device dies during the manufacture of the device to ensure that the correct processing steps or tests are performed, and that these steps or tests are performed in the correct sequence.

More specifically, FIG. 5 is a flowchart of a manufacturing process flow according to one embodiment of the invention. In this embodiment, a test flow is discussed, it being understood that the same principles apply to a formation flow that includes formation steps for forming various portions of the integrated device. An integrated circuit is tested at step A. The results of step A are characterized as pass or fail at step 82. Devices which fail are removed from the test flow to point 84. Devices that pass the test have a nonvolatile memory element, such as those described in FIGS. 7–11, programmed at step 86 to indicate that the device has successfully completed step A. At step 88, the nonvolatile memory element associated with successful completion of step A is read. Devices that have been misbinned, i.e., put in a pass bin that indicates the passing of the test when in reality the device has failed the test and should have been put in a fail bin, will not have a test-pass-status bit programmed, and will be removed from the test flow to point 90. Devices that do have the process step A bit programmed will proceed to step B.

The results of step B are characterized as pass or fail at step 92. Devices that fail are removed from the test flow to point 94. Devices that pass have a nonvolatile memory element programmed at step 96 to indicate that the device has successfully passed the testing step B. At the step 98, the nonvolatile memory element associated with the successful completion of the testing steps A and B are read. Devices that have been misbinned will not have a process-pass-status bit programmed for at least one of the steps A and B, and will be removed from the manufacturing flow to the point 99. Devices that do have the process steps A and B bits programmed will proceed to the process step C.

It should be noted that any manufacturing process step may include one or more individual formation or test steps. Also, it may be unnecessary to read all of the status memory elements before proceeding through a particular process sequence. For example, some process steps may be performed on all devices regardless of whether or not they have successfully completed all prior process steps. In this case, certain failure bits or codes may be detected at a later point in the manufacturing flow, or at an inspection point during the manufacturing process. In one embodiment, the devices that pass steps A and B have the associated memory elements A and B programmed. Before performing the step C, the memory elements A and B are checked to verify that out-of-specification parts have not inadvertently been allowed to pass through the process sequence. For the purposes of this description, the memory elements A and B may each represent one or more nonvolatile memory elements such as, but not limited to, those shown in FIGS. 7–11, antifuses, laser fuses, electrical fuses, FLASH elements, and FERAM elements. Where multiple nonvolatile memory elements are used, the step of programming an element may be accomplished by programming an appropriate one or ones of the elements. Likewise, the step of reading a memory element may include reading multiple elements and verifying the presence of a completion value associated with the data read from the elements. Devices that are removed from the manufacturing flow to the points 84, 90, 94, and 99 may be further processed according to the particular process steps not completed, or may simply be scrapped. In this way, the stored data affects, i.e., controls, the manufacturing process flow. Furthermore, this stored data need not represent an uncompleted/completed process step, but may represent other information, such as the part number or mask revision of the device, that can affect the manufacturing process flow.

The ability to record manufacturing process data, such as test results or formation steps, on a chip-by-chip basis also allows for improved fault and defect tracking through the life of the product line. Furthermore, the test results of individually failed parts can be read to determine whether the part is potentially repairable, or if the part can be utilized as a partially functional or out-of-specification device. For example, memory parts that have failed certain tests may be useful as audio random access memory (RAM) devices where a limited number of memory-bit errors can be tolerated.

Figure 6:
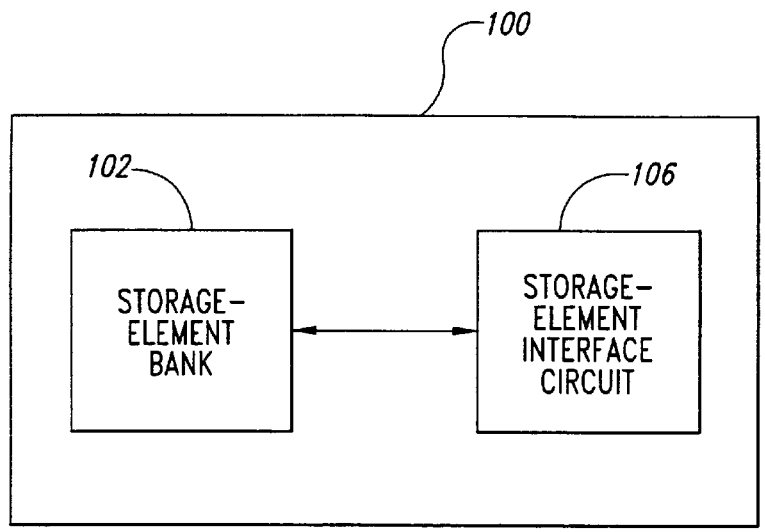
FIG. 6 is a block diagram of a semiconductor device that incorporates a nonvolatile storage element in accordance with an embodiment of the present invention.

FIG. 6 is a block diagram of a semiconductor device 100, such as a dynamic random access memory (DRAM), which includes a bank 102 of read-only storage elements 104, such as fuses (not shown in FIG. 6). A storage-element interface circuit 106 is coupled to the bank 102 and includes circuitry for determining the state of each storage element and for providing this state to an external device (not shown). Circuits that are suitable for use as the interface circuit 106 are discussed in U.S. Pat. No. 5,301,143, which is incorporated above, and U.S. Pat. No. 5,345,110, entitled "Low-Power Fuse Detect and Latch Circuit", which issued to Renfro et al. on Sept. 6, 1994 and is incorporated herein by reference.

In operation, the storage elements 104 in the bank 102 are formed such that they store information that identifies the device 100. For example, the identification information may include, e.g., the manufacturing information discussed above in conjunction with FIG. 5, the version number of the mask set used to form the device 100, the date the device 100 was manufactured, the position that the device 100, in die form, occupied in a wafer (not shown), and the part number of the device 100. The stored part number is particularly useful where the printed part number has worn off or has been intentionally removed from the package (not shown) of the device 100. Techniques for encoding the elements 104 in the bank 102 are discussed below in conjunction with FIGS. 7–9.

Figure 7:
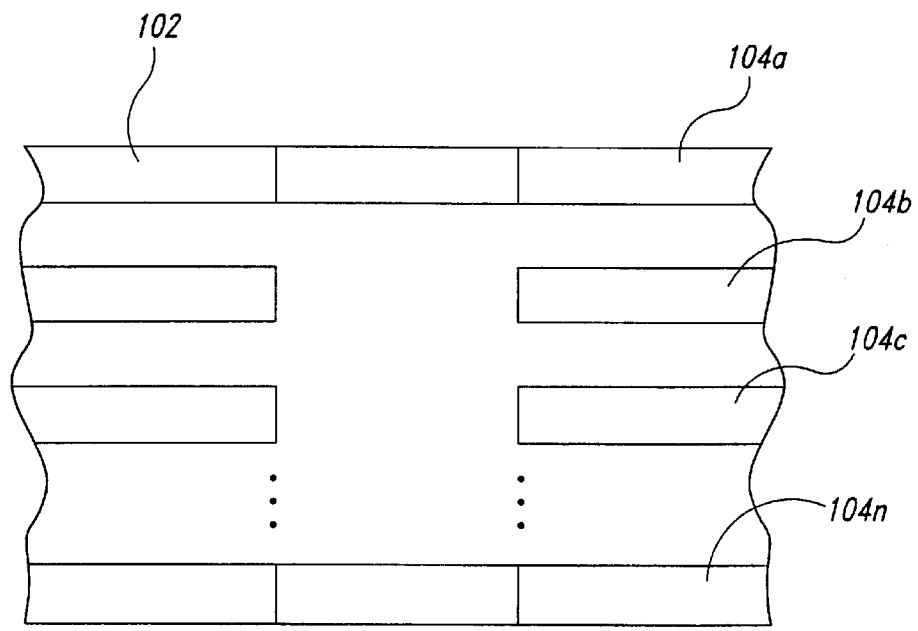
FIG. 7 is a top plan view of one embodiment of the storage-element bank of FIG. 6 with portions broken away.

FIG. 7 is a top plan view of a portion of one embodiment of the bank 102 of FIG. 6 according to the present invention. The bank 102 includes a number of read-only storage elements 104a–n. Although multiple storage elements are shown, it is understood that the bank 102 may include only one storage element 104. Typically, the storage elements 104 are each formed in a layer of conductive material within the device 100. Not all the storage elements 104 need be formed in the same conductive layer. Conductive materials that may be used to form the storage elements 104 include, e.g., polysilicon, aluminum, and other metals. For example purposes, storage elements 104a and 104n are shown in a closed state, and the storage elements 104b and 104c are shown in an opened state.

In operation, the read-only storage elements 104 are formed in their desired states. That is, the mask or masks (not shown) used to form the storage elements 104 are such that during the formation, i.e., processing, of the conductive layer or layers containing the storage elements 104, the elements 104a and 104n that are to be in a closed state to provide the desired information are formed in a closed state, and the elements 104b and 104c that are to be in an opened state to provide the desired information are formed in an opened state. Thus, the storage elements 104 are formed to store the desired information during the processing of the semiconductor device 100 (specifically, during the processing of the conductive layer containing the storage element), and not in a separate step after the processing of the device 100 as in the known techniques. Forming the storage elements 104 in their desired state during the processing of the device 100 is referred to as "preprogramming" the storage elements 104. Such preprogramming eliminates many error sources to which the prior-art techniques are susceptible, such as programming and software errors and laser alignment errors that may cause the prior-art fuse elements to be programmed in an incorrect state.

Figure 8:
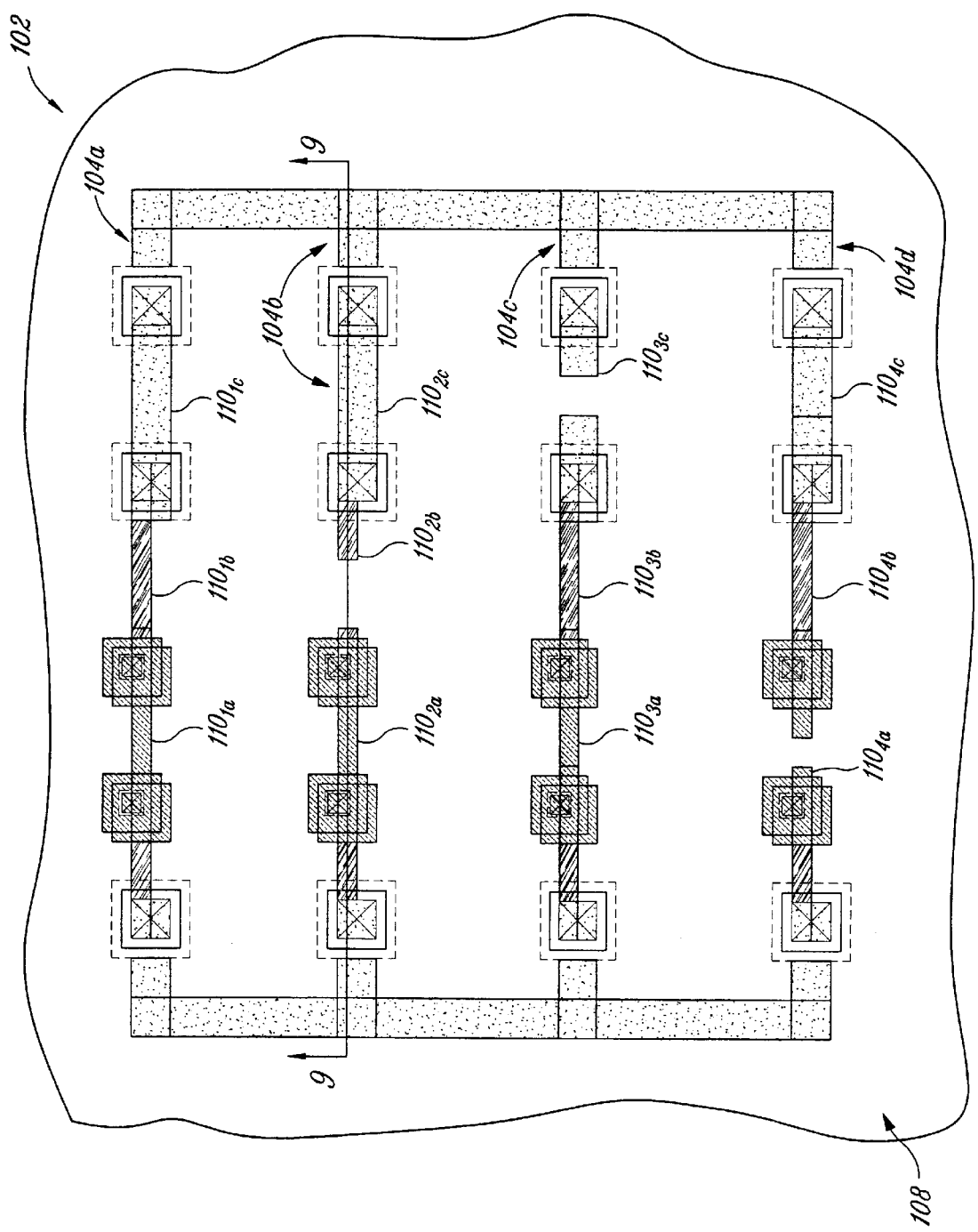
FIG. 8 is a layout diagram of a portion of another embodiment of the storage-element bank of FIG. 6.

FIG. 8 is a layout diagram of a portion of another embodiment of the storage-element bank 102 of FIG. 6. The bank 102 includes one or more read-only storage modules 108. Each storage module 108 includes a number of read-only storage elements 104 that are electrically connected in parallel. Each of the storage elements 104 includes a number of read-only storage sections or links 110 that are electrically connected in series. In the embodiment illustrated in FIG. 8, each of the storage modules 108 includes four storage elements 104, and each of the storage elements 104 includes three storage links 110, although the modules 108 may include more or fewer storage elements 104, and the storage elements 104 may each include more or fewer links 110. Each of the storage links 110 of a storage element 104 is formed in a different one of the conductive layers 112, 114, and 116 (FIG. 9) of the semiconductor device 100. Although the storage elements 104 are each shown having one link 110 per conductive layer, each storage element 104 may have more or fewer links 110 per conductive layer. In a preferred embodiment of the invention, each storage element 104 has one storage link 110 formed in each conductive layer of the semiconductor device 100. Thus, the number of links 110 in each storage element 104 equals the number of conductive layers in the semiconductor device 100. Such a structure provides advantages that are described below.

Figure 9:
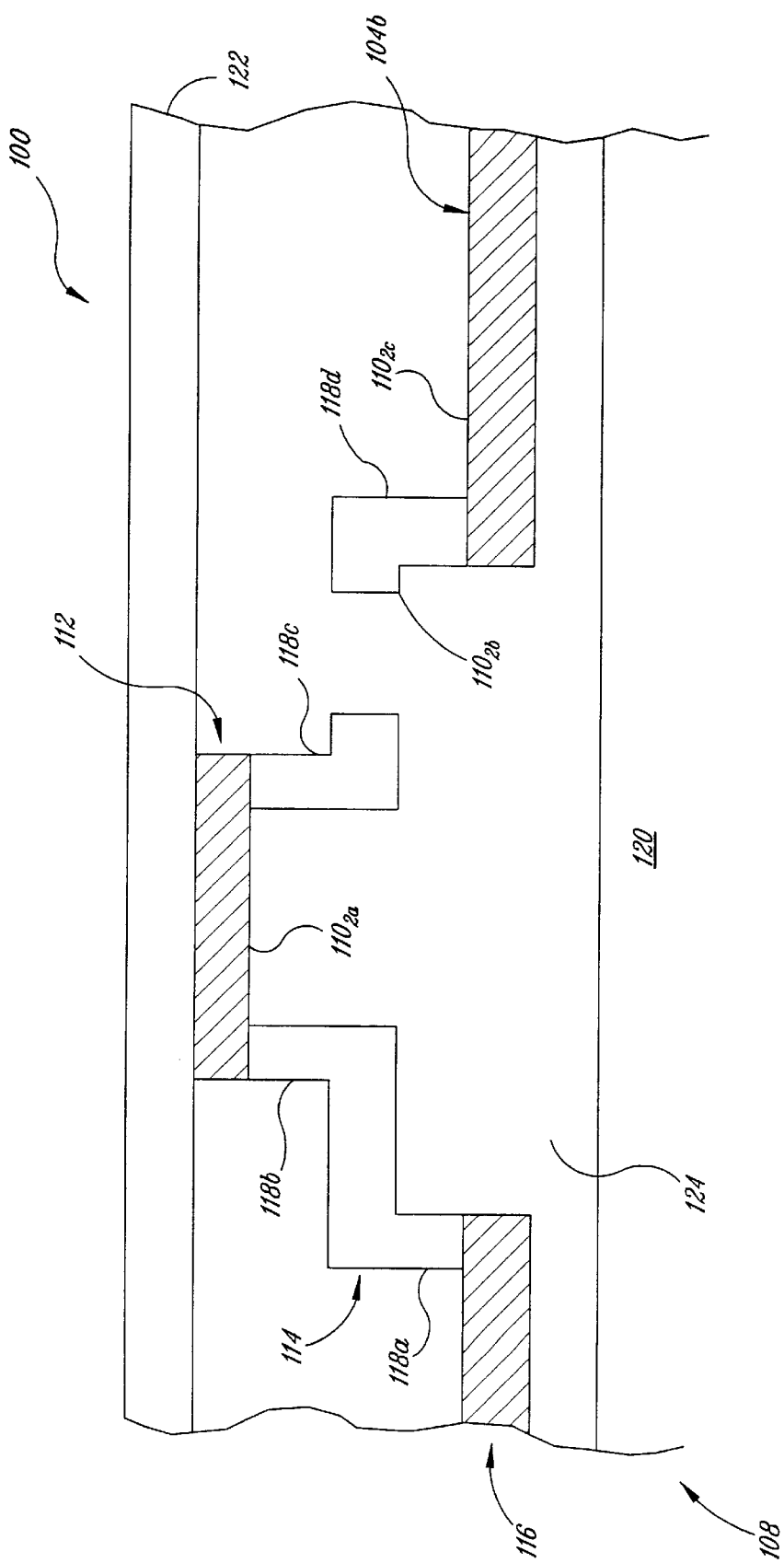
FIG. 9 is a side view of the portion of the storage-element bank of FIG. 8 taken along lines 9—9.

FIG. 9 is a side view of the device 100 taken along lines 9—9 of FIG. 8. As shown, the storage element 104b includes three storage links $110_{2a}$–$110_{2c}$, which are conventionally formed in respective conductive layers 112, 114, and 116. As shown, the links $110_{2a}$ and $110_{2b}$ are formed, i.e., preprogrammed, in a closed state, and the link $110_{2b}$ is preprogrammed in an opened state. Each of the links $110_{2a}$–$110_{2c}$ are serially coupled to one another with vertical vias 118a–118d. The vias 118 may be formed from any conductive material, such as aluminum or another metal, in a conventional manner. The uppermost layer 112 and the inner layers 114 and 116 are formed on a conventional substrate 120, and a conventional passivation layer 122 is formed over the uppermost conductive layer 112. In one embodiment of the invention, the layers 112 and 116 are formed from polysilicon, and the layer 114 is formed from a metal such as aluminum. One or more insulator layers 124 electrically isolate the layers 112, 114, and 116 from one another. The insulator layers 124 may be formed from, e.g., silicon dioxide. The other storage elements 104a, 104c, and 104d are typically formed in a manner similar to that in which the storage element 104b is formed. For example, referring to FIG. 8, the storage links $110_{1a}$, $110_{3a}$, and $110_{4a}$ are formed in the layer 112, the links $110_{1b}$, $110_{3b}$, and $110_{4b}$ are formed in the layer 114, and the links $110_{1c}$, $110_{3c}$, and $110_{4c}$ are formed in the layer 116.

Referring to FIGS. 8–9, in operation, the read-only storage module 108 is preprogrammed in either an opened or a closed state. That is, if at least one of the storage elements 104 is preprogrammed in a closed state, then the storage module 108 is preprogrammed in a closed state. But, if all of the storage elements 104 are preprogrammed in an opened state, then the storage module 108 is preprogrammed in an opened state.

Still referring to FIGS. 8–9, the storage module 108 is typically preprogrammed in one state such that it can be toggled to the other state by changing the state of a storage link or links 110 in only one of the layers 112, 114, or 116. For example, when the storage module 108 is used to store a bit of data that identifies the version number of the mask set used to form a particular device 100, in the first version of the mask set, the module 108 is typically preprogrammed in a closed state, with one of the storage elements, here 104a, preprogrammed in a closed state, and the remaining storage elements, here 104b–d, preprogrammed in an opened state. As shown, each of the opened storage elements 104b–d are opened in a different link 110, and, therefore, in a different layer 112, 114, or 116. For example and as shown, the links $110_{2b}$, $110_{3c}$, and $110_{4a}$ of the storage elements 104b–d respectively are preprogrammed in an opened state. In a subsequent version of the mask set for the device 100, suppose one wishes to toggle the state of the storage module 108 from the closed state shown in FIG. 8 to an opened state by changing, only one or more of the storage links $110_{1c}$, $110_{2c}$, $110_{3c}$, $110_{4c}$ in the layer 116. Such may be the case when circuitry or other semiconductor structures that exist only in the layer 116 need to be changed to effect the revision of the device 100. To preprogram the storage module 108 in an opened state, the storage link $110_{1c}$ is preprogrammed in an opened state instead of a closed state. Thus, in the subsequent revision of the device 100, because all of the storage elements 104a–d are preprogrammed in an opened state, the storage module 108 is preprogrammed in an opened state. Furthermore, such toggling of the state of the module 108 is accomplished by making changes thereto in only a desired one of the conductive layers 112, 114, or 116. The structure of and the techniques associated with the module 108 allow one to keep track of the mask-set version numbers by changing only the mask or masks for layers in which there are circuitry or other changes, and render unnecessary mask alterations to other conductive layers (not shown) in which there are no changes. One can also appreciate that in a further revision of the device 100, the storage module 108 can be toggled back to a closed state by closing an opened link 110 in any desired one of the layers 112, 114, and 116. In the preferred embodiment described above, the structure of module 108 allows one to toggle the state of the module 108 by making changes in any one of the conductive layers. Thus, when making mask changes to a conductive layer, one can easily toggle the state of the storage module 108 to effect a change in the stored mask-set version number. Of course, one can understand that multiple storage modules 108 can be used to store such information, with only one module 108 required to be toggled each time a mask change is made.

Figure 10:
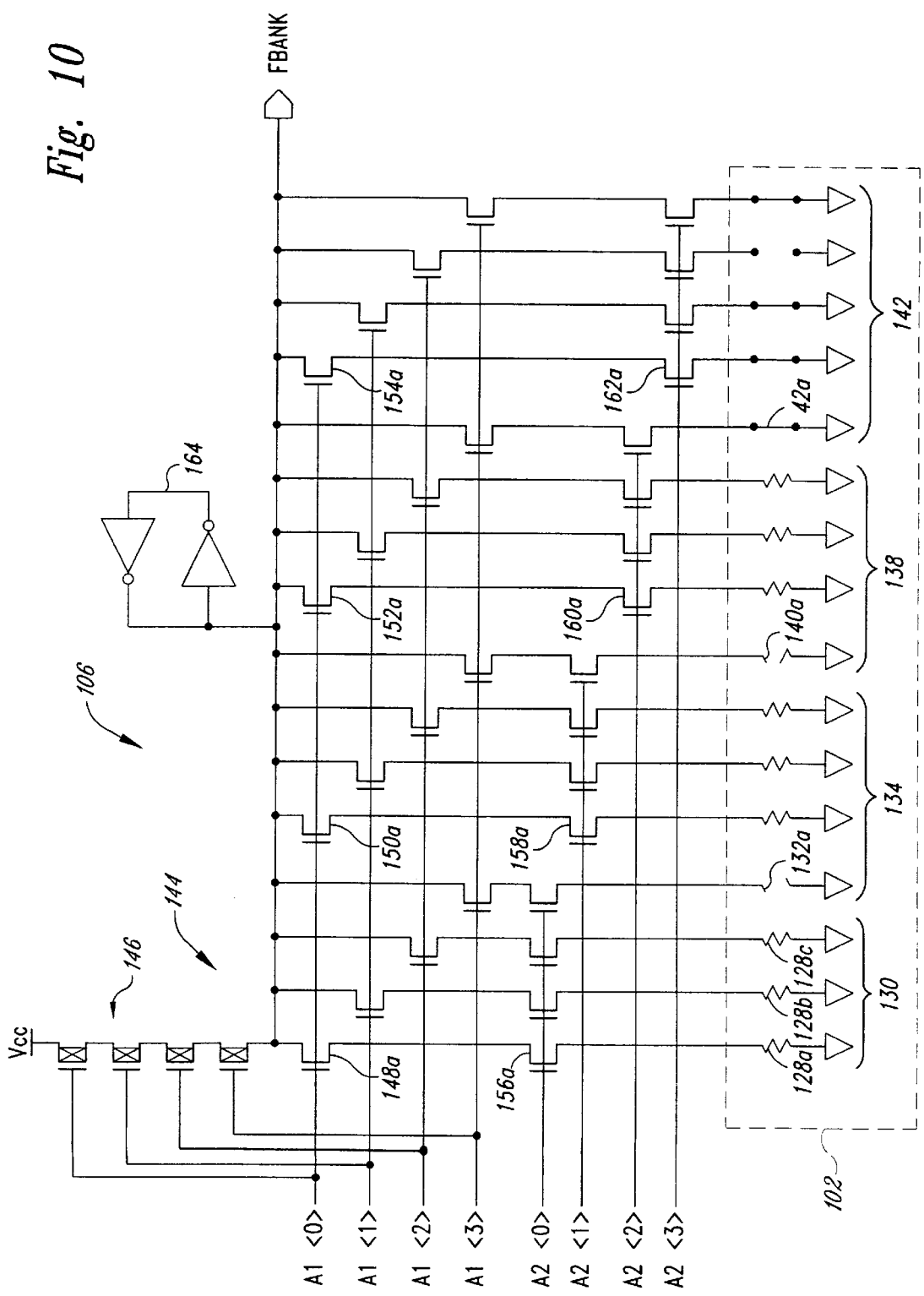
FIG. 10 is a schematic diagram of yet another embodiment of the storage-element bank of FIG. 6.

FIG. 10 is a schematic diagram of portions of the storage-element bank 102 and the storage-element interface circuit 106 of FIG. 6. The bank 102 includes one or more sets of read-only storage elements per each of a number of conductive layers of the memory device 100 of FIG. 6. The number of conductive layers that include such storage elements may range from one to the total number of conductive layers in the memory device 100. In the illustrated embodiment, the bank 102 includes a set of elements 128a–128c in a conductive layer 130, a set of elements 132a–132d in a conductive layer 134, a set of elements 136a–136d in a conductive layer 138, and a set of elements 140a–140e in a conductive layer 142. For example, in one embodiment of the invention, the conductive layer 130 is the second polysilicon layer, i.e., the "poly2" layer, the conductive layer 134 is the poly 1 layer, the conductive layer 138 is the metal-contact layer, and the conductive layer 142 is the metal-interconnect layer. Each element 128a–128c, 132a–132d, 136a–136d, and 140a–140e is formed, i.e., preprogrammed, in a predetermined state, either conductive or nonconductive, during the fabrication of the memory device 100. Thus, the predetermined states of the elements in each set permanently store a digital value associated with the conductive layer in which the set of elements is formed. In one embodiment of the invention, the digital value identifies the version number of the mask used to form the associated conductive layer. Where there are n elements in a set, the set can track $2^n$ versions of the associated mask. For example, the set of elements 128a–128c includes three elements. Thus, this set can track $2^3=8$ versions of the mask associated with the conductive layer 130. Likewise, the elements 132a–132d, 136a–136d, and 140a–140e can respectively track 16, 16, and 32 versions of the masks used to form the conductive layers 134, 138, and 142. Thus, such a bank 102 can track a change in the version of a single mask, even if the version number of the mask set, i.e., the number associated with the set of all the masks, remains the same. Such a bank 102 is useful when specific masks from different mask sets or version numbers are combined.

FIG. 10 also includes one embodiment of a read circuit 144 for the storage-element interface circuit 106. The read circuit 144 is constructed as shown in FIG. 10, receives a storage-element position address A1(0:3) and a storage-element set address A2(0:3), and provides a serial read signal FBANK. The read circuit 144 also includes load transistors 146, position access transistors 148a–148d, 150a–150d, 152a–152d, 154a–154d, set access transistors 156a–156d, 158a–158d, 160a–160d, and 162a–162d, and a weak latch 164. For balancing purposes, set transistors 156d, 158d, and 160d are associated with elements 132a, 136a, and 140a respectively, and position transistors 148d, 150d, and 152d are associated with elements 132a, 136a, and 140a respectively.

In operation, before reading a storage element 128a–c, 132a–132d, 136a–136d, or 140a–140e, the address bits of the position address A1(0:3) are driven to inactive logic 0's, which activate the serially coupled PMOS transistors 146. The active transistors 146 conduct, and thus precharge FBANK to Vcc, i.e., a logic 1. The weak latch 164 then maintains the logic 1 for FBANK. Next, corresponding address bits from the two addresses A1(0:3) and A2(0:3) are driven active high, and the associated pair of n-channel position and set transistors conduct and thus provide the state of the element being read as the signal FBANK. The signals FBANK from each set of storage elements form the digital value stored by the set. For example, when both address bits A1(0) and A2(0) are driven to active logic 1's, the serially coupled n-channel position and set transistors 148a and 156a, respectively, turn on, i.e., conduct, and provide the state of element 128a as the signal FBANK. If the element 128a is nonconductive, i.e., opened, then FBANK remains at its precharged value of logic 1. If the element 128a is conductive, i.e., closed, as is shown in FIG. 10, then the active transistors 148a and 156a overcome the output signal of the weak latch 164 and pull FBANK to ground, i.e., a logic 0. The read circuit 144 then precharges FBANK to Vcc before reading each element, and reads the elements 128b–128c. The signals FBANK generated by the set of elements 128a–128c represent the digital value stored by this set of elements. In a manner similar to that discussed for elements 128a–128c, the read circuit 144 precharges FBANK and reads the elements 132a–132d, 136a–136d, and 140a–140e.

Figure 11:
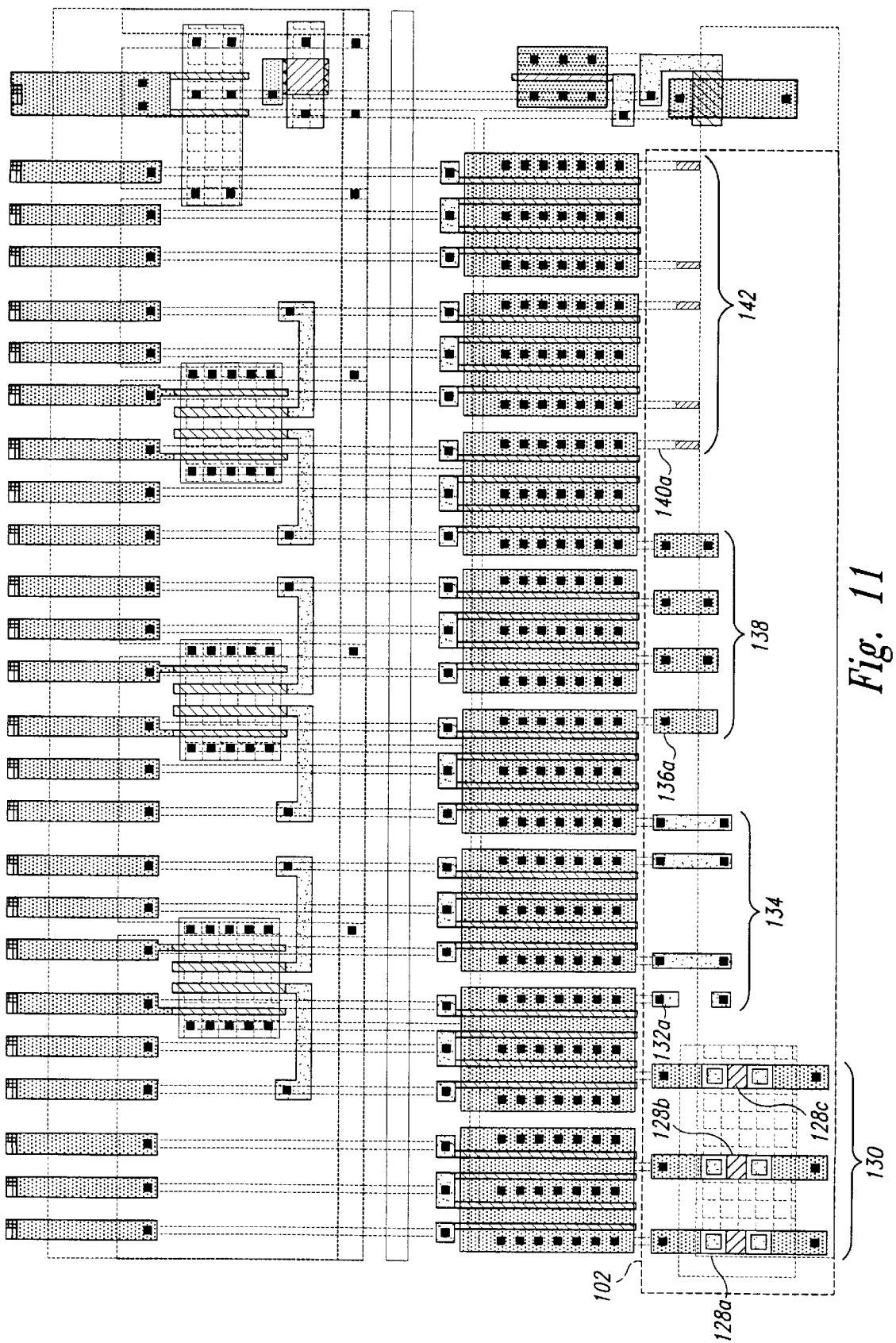
FIG. 11 is a layout diagram of the storage-element bank of FIG. 10.

FIG. 11 is a layout diagram of the circuitry shown in FIG. 10.

Figure 12:
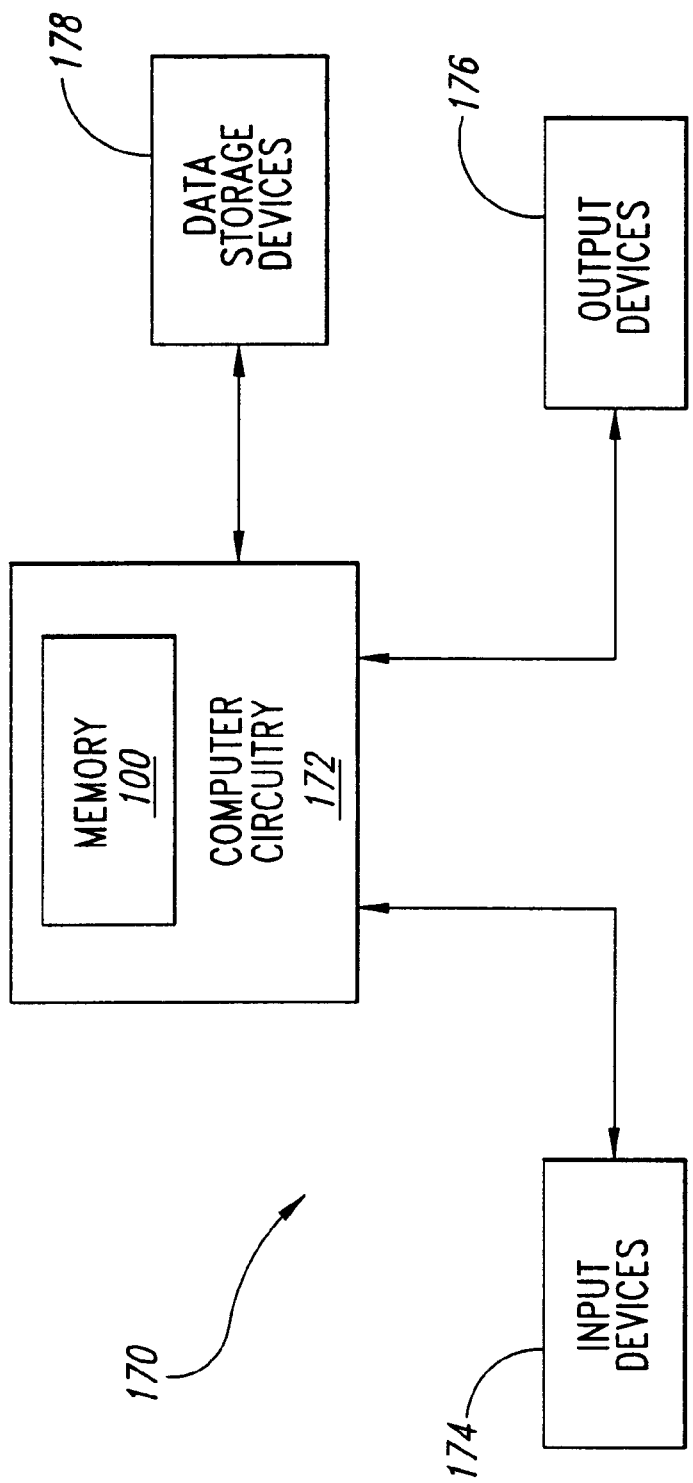
FIG. 12 is a block diagram of an electronic system that incorporates a memory device formed in accordance with an embodiment of the present invention.

FIG. 12 is a block diagram of an electronic system 170 that uses the semiconductor device 100 of FIG. 6. For example, the semiconductor device 100 may be a memory device. The computer system 170 includes computer circuitry 172 for performing computer functions, such as executing software to perform desired calculations and tasks. The circuitry 172 typically includes a processor (not shown) and the device 100. One or more input devices 174, such as a keypad or a mouse, are coupled to the computer circuitry 172 and allow an operator (not shown) to manually input data thereto. One or more output devices 176 are coupled to the computer circuitry 172 to provide to the operator data generated by the computer circuitry 172. Examples of output devices 176 include a printer and a video display unit. One or more data storage devices 178 are coupled to the computer circuitry 172 to store data on or retrieve data from external storage media (not shown). Examples of the storage devices 178 and corresponding storage media include drives that accept hard and floppy disks, tape cassettes, and compact disk read-only memories (CD-ROMs). If the device 100 is a memory device, the computer circuitry 172 is coupled to the ADDRESS and DATA buses (not shown) and the control lines (not shown) of the memory device 100. Furthermore, although shown as part of the computer circuitry 172, the device 100 may also be used in one or more of the input devices 174, output devices 176, or storage devices 178.

It will be appreciated that, although specific embodiments of the invention have been described herein for purposes of illustration, various modifications may be made without departing from the spirit and scope of the invention. For example, the fuse elements 104 and the fuse module 108 may be encoded with and thus store data other than data that identifies the semiconductor device 100. For example, the fuse elements 104 and the fuse module 108 may store the types of data discussed in conjunction with FIGS. 1–5. Accordingly, the invention is not limited except as by the appended claims.

What is claimed is:

1. An integrated circuit comprising:
   a plurality of nonvolatile memory elements each capable of storing one of at least two logic states; wherein each of said nonvolatile memory elements stores a state which is dependent upon a result of a test step that is a portion of a sequentially applied performance test; the performance test determining the substantial functionality of the integrated circuit.

2. The integrated circuit of claim 1, further comprising an array of volatile memory elements.

3. The integrated circuit of claim 1, wherein said plurality of nonvolatile memory elements comprises an antifuse.

4. The integrated circuit of claim 1, wherein two of said nonvolatile memory elements store the result of one test step of the sequentially applied performance test.

5. An integrated circuit comprising:
   a plurality of nonvolatile memory elements each of which maintains a state which is representative of a pass/fail result of a test step that is a portion of a sequentially applied test performed as part of a production process, the test step determining the substantial functionality of the portion of the integrated circuit subjected to the test.

6. The integrated circuit of claim 5, wherein said plurality of nonvolatile memory elements comprises a laser fuse.

7. An integrated circuit comprising:
   a plurality of nonvolatile memory elements which store one of a plurality of possible test step results of a sequentially applied test performed in the process of determining the substantial functionality of the integrated circuit.

8. The integrated circuit of claim 7, wherein the one test step result represents a bin number test result.

9. A Dynamic Random Access Memory device comprising:
   a plurality of nonvolatile memory elements each of which maintains a data value which represents a result of a test step that is a portion of a sequentially applied performance test performed on the Dynamic Random Access Memory device, the performance test determining the substantial functionality of the device.

10. The Dynamic Random Access Memory device of claim 9, further comprising a second plurality of nonvolatile memory elements which are coupled to a plurality of redundant memory elements.

11. The Dynamic Random Access Memory device of claim 10, wherein said second plurality of nonvolatile memory elements comprises an antifuse.

12. The Dynamic Random Access Memory device of claim 9, wherein at least a portion of said nonvolatile memory elements are antifuses which are programmed after the Dynamic Random Access Memory device is packaged.

13. A system comprising:
    an integrated circuit which comprises a plurality of nonvolatile memory elements each capable of storing a binary logic state, wherein each of said nonvolatile memory elements stores a state which is dependent upon a result of a test step that is a portion of a sequentially applied performance test; the performance test determining the substantial functionality of the integrated circuit.

14. The system of claim 13, wherein said integrated circuit is a microprocessor.

15. The system of claim 13, wherein said integrated circuit is a memory device.

16. A memory module comprising:
    an integrated circuit comprising a plurality of nonvolatile memory elements each capable of storing one of at least two logic states wherein each of said nonvolatile memory elements stores a state which is dependent upon a result of a test step that is a portion of a sequentially applied performance test; the performance test determining the substantial functionality of the integrated circuit.

17. The memory module of claim 16, wherein the memory module is a Dual In Line Memory Module.

18. The memory module of claim 16, wherein said integrated circuit is a FLASH memory device.

19. The memory module of claim 16, wherein said integrated circuit is a Dynamic Random Access Memory device and said nonvolatile memory elements are comprised of antifuse circuits.

20. An integrated circuit, comprising:
    a substrate;
    a plurality of conductive layers disposed on the substrate; and
    a read-only storage element having two electrically intercoupled storage sections that are each disposed in a different one of two of the layers and that each have a respective conductivity, a logic state that is stored in the read-only storage element being identified by the respective conductivities of the storage sections, the conductivities resulting either from an electrically closed path through the storage sections, or an electrically opened path through the storage sections, the state having been stored in the read-only storage element during the manufacture of the integrated circuit, the state describing a process used to manufacture the integrated circuit.

21. The integrated circuit of claim 20 wherein said storage sections are serially intercoupled.

22. The integrated circuit of claim 20 wherein the state describes a process step that formed a portion of the integrated circuit.

23. The integrated circuit of claim 20 wherein the state describes a result of a process step that tested the integrated circuit.

24. A semiconductor device, comprising:

a substrate;

multiple conductive layers disposed on the substrate; and a read-only storage module that includes multiple read-only storage elements that are electrically intercoupled in parallel, each read-only storage element including multiple read-only storage links that are electrically and serially intercoupled and that each have a respective conductivity, a logic state that is stored in the read-only storage module being identified by the respective conductivities of the storage links, the conductivities resulting either from an electrically closed path through the storage links, or an electrically opened path through the storage links, the state having been stored in the read-only storage module during the manufacture of the semiconductor device, the state describing a process used to manufacture the semiconductor device.

25. The semiconductor device of claim 24 wherein each read-only storage link of each the read-only storage elements is disposed in a different one of the layers such that the stored state can be changed by changing the conductivity of one or more of the storage links in only one of the layers during the formation of the only one layer.

26. The semiconductor device of claim 24 wherein one of the read-only storage elements is electrically closed, and remaining ones of the read-only storage elements are electrically opened.

27. The semiconductor device of claim 24 wherein:

the read-only storage module includes at least three read-only storage elements;

two or more of the read-only storage elements each include a single, electrically opened read-only storage link; and each of the layers includes at most one electrically opened read-only storage link.

28. The semiconductor device of claim 24, further comprising one or more vias that serially intercouple the respective read-only storage links of each read-only storage element.

29. An integrated device, comprising:

a substrate;

a conductive layer formed on the substrate; and one or more read-only storage elements disposed in the conductive layer, each of the storage elements formed in a respective predetermined logic state during the manufacture of the integrated device, the logic state resulting either from an electrically closed path through the storage elements, or an electrically opened path through the storage elements, and wherein the states of the storage elements collectively describe a process used to manufacture the integrated circuit.

30. A semiconductor structure, comprising:

a substrate;

a first plurality of conductive layers disposed on the substrate; and a second plurality of read-only storage elements disposed in the conductive layers, each conductive layer having disposed therein at least a respective one of the storage elements, a logic state having been stored in the respective storage element during the manufacture of the semiconductor structure, the logic state resulting either from an electrically closed path through the storage elements, or an electrically opened path through the storage elements, and wherein the state describes a portion of a process used to manufacture the semiconductor structure, the portion of the process having occurred before or during the formation of the conductive layer in which the respective storage element is disposed.

31. The semiconductor structure of claim 30 wherein each conductive layer has disposed therein more than one of the storage elements.

32. The semiconductor structure of claim 30 wherein the first plurality equals the second plurality.

33. The semiconductor structure of claim 30 wherein the state describes a process step that formed a portion of the integrated circuit.

34. The semiconductor structure of claim 30 wherein the state describes a result of a process step that tested the integrated circuit.

35. An integrated circuit, comprising:

a substrate;

a plurality of conductive layers disposed on the substrate; and a read-only storage element having two electrically intercoupled storage sections that are each disposed in a different one of two of the layers and that each have a conductivity, a logic state that is stored in the read-only storage element being identified by either an electrically closed path through the storage elements, or an electrically opened path through the storage elements, the state having been used to control a manufacturing flow during the manufacture of the integrated circuit.

36. The integrated circuit of claim 34 wherein the stored state caused a predetermined process step to be performed during the manufacture of the integrated circuit, the process step having formed a part of the integrated circuit.

37. The integrated circuit of claim 34 wherein the stored state caused a predetermined process step to be omitted during the manufacture of the integrated circuit.

38. The integrated circuit of claim 34 wherein the stored state caused a predetermined process step to be performed during the manufacture of the integrated circuit, the process step having been a test of the integrated circuit.

39. A semiconductor device, comprising:

a substrate;

multiple conductive layers disposed on the substrate; and a read-only storage module that includes multiple read-only storage elements that are electrically intercoupled in parallel, each read-only storage element including multiple read-only storage links that are electrically and serially intercoupled and that each have a respective conductivity, a logic state that is stored in the read-only storage module being identified by either an electrically closed path through the storage elements, or an electrically opened path through the storage elements, the state having been used to control a manufacturing flow during the manufacture of the semiconductor device.

40. The semiconductor device of claim 34 wherein each read-only storage link of each the read-only storage elements is disposed in a different one of the layers such that the stored state can be changed by changing the conductivity of one or more of the storage links in only one of the layers during the manufacture of the only one layer.

41. An integrated device, comprising:

a substrate;

a conductive layer disposed on the substrate; and one or more read-only storage elements disposed in the conductive layer, each of the storage elements formed in a respective predetermined logic state during the manufacture of the integrated device, the logic state resulting either from an electrically closed path through the storage elements, or an electrically opened path through the storage elements, and wherein the states of the storage elements having been used together to control a manufacturing flow during the manufacture of the integrated device.

42. The integrated device of claim 41 wherein the stored states together identify a characteristic of the integrated device.

43. A semiconductor structure, comprising:
a substrate;
a first plurality of conductive layers disposed on the substrate; and
a second plurality of read-only storage elements disposed in the conductive layers, each conductive layer having disposed therein at least a respective one of the storage elements, the respective storage element storing a logic state that was used to control a manufacturing flow during the manufacture of the semiconductor structure and before or during the formation of the conductive layer in which the respective storage element is disposed, wherein the logic state results either from an electrically closed path through the storage elements, or an electrically opened path through the storage elements.

44. An electronic system, comprising:
a data input device;
a data output device; and
computing circuitry coupled to the data input and output devices, the computing circuitry including a memory device that includes,
a substrate,
a plurality of conductive layers formed on the substrate, and
a fuse read-only storage element having two electrically intercoupled storage sections that are each disposed in a different one of two of the layers and that each have a respective conductivity, a logic state that is stored in the read-only storage element being identified by either an electrically closed path through the storage elements, or an electrically opened path through the storage elements, the state having been stored in the read-only storage element during the manufacture of the memory device, the state describing a process used to manufacture the memory device.

45. The electronic system of claim 44 wherein the storage sections are serially intercoupled.

46. The electronic system of claim 44 wherein at least one of the layers comprises polysilicon.

47. The electronic system of claim 44 wherein at least one of the layers comprises a metal.

48. An electronic system, comprising:
a data input device;
a data output device; and
computing circuitry coupled to the data input and output devices, the computing circuitry including a memory device that includes,
a substrate,
a conductive layer disposed on the substrate, and
one or more read-only storage elements disposed in the conductive layer, each of the storage elements formed in a respective predetermined logic state during the manufacture of the memory device, the logic state resulting from either an electrically closed path through the storage elements, or an electrically opened path through the storage elements, the states of the storage elements collectively describing a process used to manufacture the memory device.

49. The electronic system of claim 48 wherein the memory device further comprises a plurality of conductive layers disposed on the substrate, each conductive layer having disposed therein one or more read-only storage elements, each of the storage elements formed in a respective predetermined logic state during the manufacture of the memory device, the states of the storage elements collectively describing a process used to manufacture the memory device.

50. An electronic system, comprising:
a data input device;
a data output device; and
computing circuitry coupled to the data input and output devices, the computing circuitry including a memory device that includes,
a substrate,
a conductive layer disposed on the substrate, and
one or more read-only storage elements disposed in the conductive layer, each of the storage elements formed in a respective predetermined logic state during the manufacture of the memory device, the logic state resulting from either an electrically closed path through the storage elements, or an electrically opened path through the storage elements, the states of the storage elements having been used together to control a manufacturing flow during the manufacture of the memory device.

51. An electronic system, comprising:
a data input device;
a data output device; and
computing circuitry coupled to the data input and output devices, the computing circuitry including a memory device that includes,
a substrate,
a plurality of conductive layers disposed on the substrate, and
a fuse read-only storage element having two electrically intercoupled storage sections that are each disposed in a different one of two of the layers and that each have a respective conductivity, a logic state that is stored in the read-only storage element being identified by either an electrically closed path through the storage elements, or an electrically opened path through the storage elements, the state having been used to control a manufacturing flow during the manufacture of the memory device.

* * * * *

UNITED STATES PATENT AND TRADEMARK OFFICE
CERTIFICATE OF CORRECTION

PATENT NO. : 6,194,738 B1
DATED : February 27, 2001
INVENTOR(S) : Debenham et al.

Page 1 of 1

It is certified that error appears in the above-identified patent and that said Letters Patent is hereby corrected as shown below:

<u>Column 14,</u>
Line 57, "device of claim 34 wherein" should read -- device of claim 39 wherein --

Signed and Sealed this

Thirtieth Day of October, 2001

*Attest:*

*Attesting Officer*

NICHOLAS P. GODICI
*Acting Director of the United States Patent and Trademark Office*